United States Patent [19]

Nakamura et al.

[11] Patent Number: 5,412,357
[45] Date of Patent: May 2, 1995

[54] NOISE FILTER HAVING NON-LINEAR VOLTAGE-DEPENDENT RESISTOR BODY WITH A RESISTIVE LAYER

[75] Inventors: Kazutaka Nakamura; Hiroji Tani; Yasunobu Yoneda; Yukio Sakabe, all of Nagaokakyo, Japan

[73] Assignee: Murata Mfg. Co., Ltd., Nagaokakyo, Japan

[21] Appl. No.: 36,438

[22] Filed: Mar. 24, 1993

[30] Foreign Application Priority Data

Mar. 25, 1992 [JP] Japan .................................. 4-100429

[51] Int. Cl.6 ............................................. H03H 7/06
[52] U.S. Cl. .................. 333/181; 333/184; 338/21; 338/332
[58] Field of Search ............... 333/181, 184, 185, 12; 338/21, 20, 307, 308, 313, 314, 272, 273, 332; 361/321; 252/514

[56] References Cited

U.S. PATENT DOCUMENTS

| | | | |
|---|---|---|---|
| 4,400,683 | 8/1983 | Eda et al. | 338/21 |
| 4,706,060 | 11/1987 | May | 338/20 |
| 5,008,646 | 4/1991 | Hennings et al. | 338/21 X |
| 5,059,941 | 10/1991 | Gofuku et al. | 338/307 |
| 5,075,665 | 12/1991 | Tarra et al. | 338/21 |
| 5,159,300 | 10/1992 | Nakamura et al. | 333/184 |
| 5,164,698 | 11/1992 | Palanisamy | 338/314 |
| 5,173,670 | 12/1992 | Naito et al. | 333/184 |

FOREIGN PATENT DOCUMENTS

| | | | |
|---|---|---|---|
| 0152704 | 6/1989 | Japan | 338/21 |
| 0260605 | 10/1990 | Japan | 338/21 |
| 3080503 | 4/1991 | Japan | 338/21 |

*Primary Examiner*—Seungsook Ham
*Attorney, Agent, or Firm*—Ostrolenk, Faber, Gerb & Soffen

[57] ABSTRACT

A noise filter including semi-conductor ceramics having voltage non-linearity characteristics. End surface electrodes are formed on a pair of opposing end surfaces of the semi-conductor ceramics and side surface electrodes are formed on a pair of side surfaces thereof. A first inner electrode is formed inside the semi-conductor ceramics having one end surface electrically connected to one of the end surface electrodes. A second inner electrode is formed inside the semi-conductor ceramics so as to be overlapped with the first inner electrode and separated therefrom by a ceramic layer. Both end surfaces of the second inner electrode are electrically connected to the pair of side surface electrodes. At least one resistance layer is embedded in the semi-conductor ceramics so that both end surfaces of the resistance layer are electrically connected to the pair of end surface electrodes.

15 Claims, 3 Drawing Sheets

NOISE FILTER HAVING NON-LINEAR VOLTAGE-DEPENDENT RESISTOR BODY WITH A RESISTIVE LAYER

BACKGROUND OF THE INVENTION

1. Field of the Invention

The present invention relates generally to a three-terminal type noise filter constructed using semiconductor ceramics having voltage non-linearity characteristics, and more particularly, to a three-terminal type noise Filter having varistor characteristics, capacitor characteristics and resistance characteristics.

2. Description of the Prior Art

In a semiconductor device such as an IC or a LSI employed in computer equipment, it has been important to prevent the destruction and the malfunction due to entrance of transient noise such as a static surge. As a method of protecting the semiconductor device from the entrance of transient noise, various methods have been conventionally tried. For example, attempts have been made to devise a method of setting a ground potential of an electronic equipment or a substrate and a method of arranging electronic component elements on a substrate. Alternatively, a method of absorbing noise by adding to a circuit a disk type varistor constructed by Forming electrodes on both major surfaces of single plate type semiconductor ceramics or a LC filter has been tried.

The method using the varistor out of the foregoing various methods is more suitable than the other methods because the varistor is simply added to the circuit, the varistor can be operated at a low voltage, and the capacity of the varistor is low. When the varistor is used as a noise absorbing element, it is necessary that the varistor voltage be as close as possible to a circuit voltage. On the other hand, in the electronic equipment such as the computer equipment, an operating voltage of the semiconductor device is relatively low. Accordingly, it is needed to reduce the varistor voltage of the varistor used.

Furthermore, miniaturization and thinning of the computer equipment or the like have proceeded in recent years. When the varistor is used as a noise absorbing element, it is required that the varistor cope with miniaturization and surface mounted technology (SMT). However, the above described disk type varistor cannot cope with miniaturization and surface mounted technology. Therefore, a monolithic type varistor has been proposed as an alternative to the disk type varistor (for example, Japanese Patent Publication No. 23921/1983).

However, the monolithic type varistor disclosed in the above described prior art document is approximately the same as the conventional disk type varistor in clamping voltage, although it can cope with miniaturization and surface mounted technology. Consequently, the semiconductor device cannot, in some cases, be protected from entrance of noise, resulting in a demand for improvement in noise absorbing power. In addition, although a breakdown voltage of the above described semiconductor device differs depending on the type, a breakdown voltage of a MOS IC or the like is, in many cases, approximately 40 to 60 V. On the other hand, the ability to restrain a voltage of the above described monolithic type varistor is two to three times the varistor voltage. The lower the varistor voltage is, the higher the ability to restrain a voltage is. Accordingly, in an impulse of a static charge or the like, a clamping voltage is made higher. As a result, the monolithic type varistor alone cannot, in some cases, protect the semiconductor device or the like.

Meanwhile, it is considered that if a resistance is added to the above described monolithic type varistor, however, the ability to restrain a voltage in excess of the ability of the monolithic type varistor can be obtained. When a resistance element is added to the monolithic type varistor as a separate component, however, the cost of the monolithic type varistor is increased by the cost of the resistance element. Moreover, the space required for mounting is increased. In addition, it is considered that the surface of the monolithic type varistor is coated with a resistance film. When the surface of the monolithic type varistor is coated with the resistance film, however, the resistance film is liable to be damaged due to the mechanical load from the exterior. As a result, electrical characteristics are degraded, thereby shortening the life.

SUMMARY OF THE INVENTION

The present invention has been made in order to overcome the above described disadvantages of the conventional monolithic type varistor and has for its object to provide a new noise filter capable of reliably preventing the destruction and the malfunction of a semiconductor device due to noise by enhancing the ability to restrain a voltage, capable of avoiding the increase in cost and the increase in a space for mounting, and capable of avoiding the decrease in the life of the elements.

According to the present invention, there is provided a noise filter comprising semiconductor ceramics, composed of a semiconductor material having voltage non-linearity characteristics, and having a pair of end surfaces opposed to each other and a pair of side surfaces connecting said pair of end surfaces. End surface electrodes are respectively formed on both the end surfaces of the semiconductor ceramics, side surface electrodes are respectively formed on both the side surfaces of the semiconductor ceramics, a first inner electrode is formed inside the semiconductor ceramics and electrically connected to one of the end surface electrodes, a second inner electrode is formed inside the semiconductor ceramics so as to be overlapped with the first inner electrode while being separated from the first inner electrode by a semiconductor ceramic layer, the second inner electrode being electrically connected to the above described side surface electrodes, and a resistance layer is formed inside the semiconductor ceramics and electrically connected to the area between the pair of end surface electrodes.

As a material composing the above described resistance layer, one mainly composed of Ru is suitable. A material having at least one of $Pb_2Ru_2O_7$ and $Bi_2Ru_2O_7$ mixed with $RuO_2$ is particularly desirable. The reason for this is that the resistance value can be easily controlled by $Pb_2Ru_2O_7$ and/or $Bi_2Ru_2O_7$, and can be set to a desirable resistance value by suitably changing the length and the area of the resistance layer and the number of resistance layers that are laminated. In addition, it is desirable that the amount of addition of $Pb_2Ru_2O_7$ and/or $Bi_2Ru_2O_7$ is not more than 60% by weight. If the amount of addition exceeds 60% by weight, the resistance value varies.

Furthermore, as a ceramic material composing the semiconductor ceramics, one mainly composed of ZnO is suitably used in consideration of the temperature at the time of sintering.

Additionally, it is desirable that a surface portion excluding the respective electrodes of the above described semiconductor ceramics be coated with a glass film, thereby making it possible to improve humidity resistance as well as to reduce a leakage current.

In the noise filter according to the present invention, the resistance layer is added between the end surface electrodes in the semiconductor ceramics. Accordingly, it is possible to control a voltage in excess of the ability of the varistor by the above described resistance layer while obtaining voltage non-linearity characteristics between the first and second inner electrodes. Consequently, it is possible to reliably prevent the destruction and the malfunction of the semiconductor device due to entrance of transient noise.

Additionally, the above described resistance layer is embedded in the semiconductor ceramics. Accordingly, it is possible to avoid the increase in the cost and the increase in the space for mounting, which occur in a case where a resistance component is separately externally provided. In addition, it is possible to avoid damage due to the mechanical load from the exterior, which occurs in a case where the surface of the semiconductor ceramics is coated with the resistance film, resulting in improvement in life characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
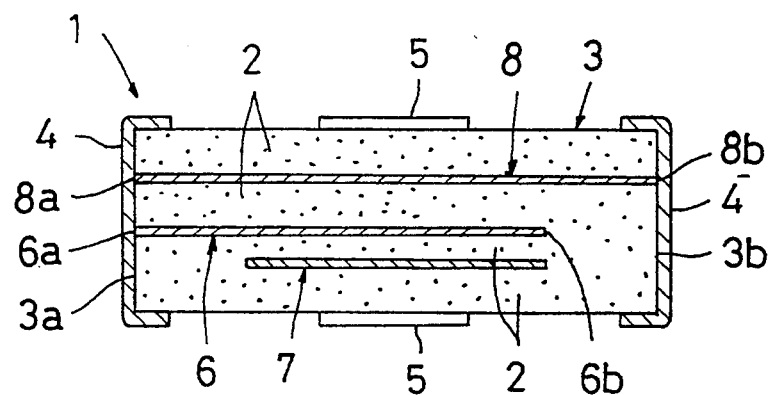
FIGS. 1A and 1B are respectively a vertical sectional view and a transverse sectional view showing a noise filter according to one embodiment of the present invention.
Figure 1B:
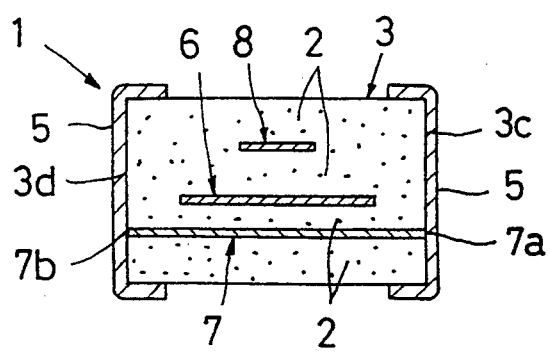
Figure 2:
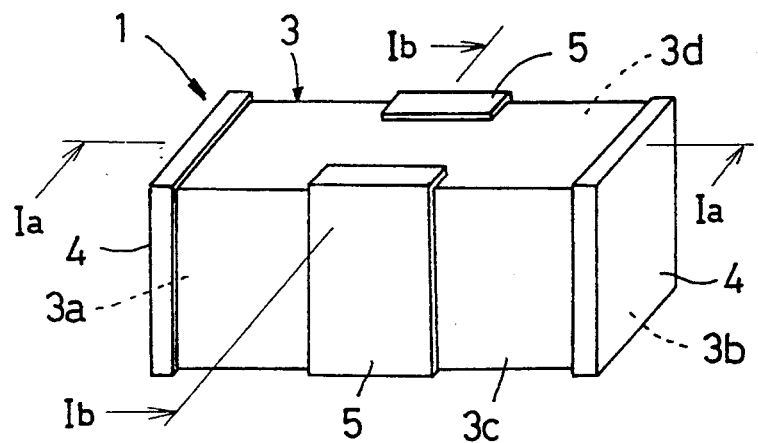
FIG. 2 is a perspective view showing the noise filter according to the embodiment shown in FIG. 1.

FIGS. 1A to 4 are diagrams for explaining a noise filter according to one embodiment of the present invention.

In the drawings, reference numeral 1 denotes a three-terminal type noise filter having voltage non-linearity characteristics, capacitor characteristics and resistance characteristics according to the present embodiment. The noise filter 1 has semiconductor ceramics 3, in the shape of a rectangular parallelopiped, constructed by laminating a plurality of ceramic layers 2, mainly composed of ZnO, and cofiring the laminated body obtained. End surface electrodes 4 for connecting outer circuits composed of Ag are respectively formed on end surfaces 3a and 3b of the semiconductor ceramics 3. Side surface electrodes 5 for connecting outer circuits similarly composed of Ag are respectively formed in central parts of side surfaces 3c and 3d along the length of the semiconductor ceramics 3.

Furthermore, a first inner electrode 6 composed of a Ag - Pd alloy is arranged inside the above describe semiconductor ceramics 3. One end surface 6a of the inner electrode 6 is exposed to the side surface 3a of the semiconductor ceramics 3 and connected to the end surface electrode 4. The other end surface 5b is sealed in the semiconductor ceramics 3, although it is in close proximity to the end surface 3b of the semiconductor ceramics 3.

Furthermore, inside the above described semiconductor ceramics 3, a second inner electrode 7 is arranged parallel to and overlapped with the first inner electrode 6 with the ceramic layer 2 being interposed therebetween. Both end surfaces 7a and 7b of the second inner electrode 7 are respectively exposed to the side surfaces 3c and 3d of the semiconductor ceramics 3 and connected to the side surface electrodes 5, so that a portion interposed between the first and second inner electrodes 6 and 7 becomes the ceramic layer 2 exhibiting voltage non-linearity characteristics. In addition, an outer surface, other than a portion where the end surface electrodes 4 and the side surface electrodes 5 are formed, of the above described semiconductor ceramics 3 is coated with a glass film, which is not shown.

A resistance layer 8, constructed by mixing not more than 60% by weight of $Pb_2Ru_2O_7$ and $Bi_2Ru_2O_2$ with $RuO_2$, is embedded above the first inner electrode 6 in the above described semiconductor ceramics 3. This resistance layer 8 is a strip-shaped one extending toward both the end surfaces 3a and 3b of the semiconductor ceramics 3. Accordingly, both end surfaces 8a and 8b of the resistance layer 8 are exposed at both the end surfaces 3a and 3b and connected to the end surface electrodes 4. In addition, the above described resistance layer 8 is set so as to have a predetermined resistance value by selecting the thickness and the width thereof.

Description is now made of one manufacturing method of the noise filter 1 according to the present embodiment.

First, ZnO having purity of not less than 99% is used as a main component. ZnO, $Bi_2O_3$, $CoCO_3$, $MnO_2$ and $Sb_2O_2$ are respectively weighed in proportions of 98 mol %, 0.5 mol %, 0.5 mol %, 0.5 mol % and 0.5 mol %. Pure water is added to ZnO, and $Bi_2O_3$, $CoCO_3$, $MnO_2$ and $Sb_2O_2$, followed by mixing by a ball mill for 24 hours, to form a slurry. This slurry is filtered and dried to be granulated and then, is temporarily calcined at a temperature of 800° C. for two hours, to obtain a calcined product.

The above described calcined product is then coarsely powdered by a pulverizer and then, pure water is added to the coarse powder obtained. The coarse powder is Finely powdered by a ball mill. The fine powder obtained is then filtered and dried and then, along with an organic binder, is dispersed in a solvent, to form a slurry. Thereafter, a ceramic green sheet having a thickness of 50 μm is formed by a Doctor blade process from the slurry, and this green sheet is cut to predetermined sizes, thereby to form a plurality of ceramic layers 2.

A conductive paste composed of a Ag - Pd (7:3 weight ratio) alloy is printed by screen processing printing on the upper surface of the above described ceramic layer 2, to form a first inner electrode 6. This inner electrode 6 is so formed that one end surface 6a is positioned at an outer edge on the right side of the ceramic layer 2, the other end surface 6b and the remaining end surface are positioned inside the ceramic layer 2. In addition, a conductive paste is similarly printed on the upper surface of another ceramic layer 2, to form a second inner electrode 7. This second inner electrode 7 is so formed that both end surfaces 7a and 7b are positioned at both side edges extending in the longitudinal direction of the ceramic layer 2 and the remaining end surface is positioned inside the ceramic layer 2.

Not more than 60% by weight of $Pb_2Ru_2O_7$ and $Bi_2Ru_2O_7$ are mixed with $RuO_2$, a varnish containing 10% by weight of glass is added to the mixture obtained, to produce a resistive paste. This resistive paste is printed by screen process printing on the upper surface of another ceramic layer 2, to form a resistance layer 8. This resistance layer 8 is formed so that both end surfaces 8a and 8b are positioned at left and right outer edges of the ceramic layer 2 and the other end surface is positioned inside the ceramic layer 2.

Figure 3:
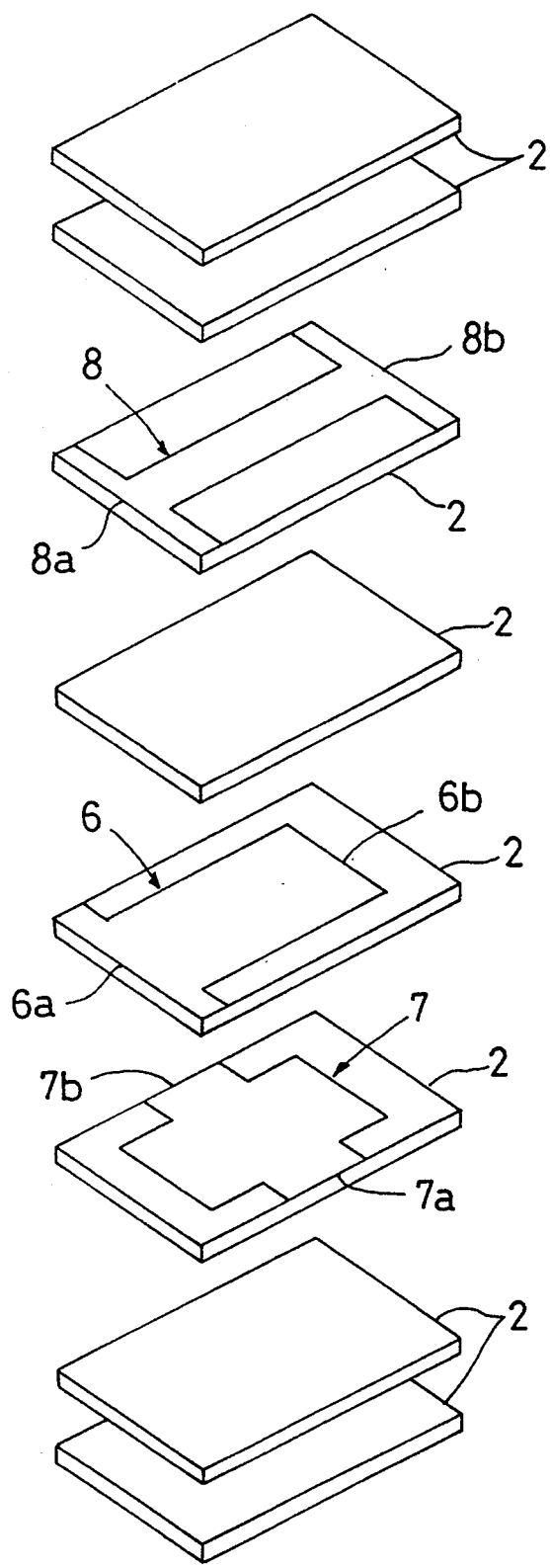
FIG. 3 is an exploded perspective view showing the noise filter according to the embodiment shown in FIG. 1.

As shown in FIG. 3, the first inner electrode 6 and the second inner electrode 7 are overlapped with each other so as to be opposed to each other with the ceramic layer 2 being interposed therebetween, the ceramic layer 2 having the resistance layer 8 formed thereon is overlapped with the upper surface of the above described first inner electrode with a dummy ceramic layer 2 being interposed therebetween, and two dummy ceramic layers 2 are overlapped with each of upper and lower surfaces of a multilayered body obtained. A pressure of $2t/cm^2$ is then applied in the direction of lamination, to form a laminated body.

The above described laminated body is then cut to predetermined sizes and is sintered at a temperature of 900° C. for two hours, to obtain semiconductor ceramics 3. A Ag paste is applied to central parts of the left and right end surfaces 3a and 3b and the front and rear side surfaces 3c and 3d of the semiconductor ceramics 3, followed by sintering at a temperature of 800° C. for ten minutes, to form end surface electrodes 4 and side surface electrodes 5. Thereafter, a glass paste is applied to the outer surface, excluding portions where the end surface electrodes 4 and the side surface electrodes 5 are formed, of the above described semiconductor ceramics 3, to form a glass film. Consequently, a noise filter 1 according to the present embodiment is fabricated.

In the noise filter 1 according to the present embodiment, the power supply is connected to the area between one of the end surface electrodes 4 and one of the side surface electrodes 5, and a semiconductor device A is connected to the area between the other end surface electrode 4 and the other side surface electrode 5. Consequently, an abnormal voltage is prevented from being applied to the semiconductor device A, and overvoltage energy in excess of the ability to restrain a voltage of a varistor portion Z is absorbed by the resistance layer 8.

According to the present embodiment, the resistance layer 8 is added between the end surface electrodes 4 in the semiconductor ceramics 3, and this resistance layer 8 is embedded in the semiconductor ceramics 3. Accordingly, even if noise larger than a breakdown voltage of the semiconductor device A enters the semiconductor ceramics 3, the noise can be restrained by the resistance layer 8. As a result, the destruction and the malfunction of the semiconductor device such as an IC and a LSI can be reliably avoided.

Furthermore, the noise filter 1 is so constructed so that the above described resistance film 8 is contained in the semiconductor ceramics 3. Accordingly, the cost of components can be reduced and a space for mounting can be decreased, as compared with a case where a resistance component is separately externally provided. In addition, miniaturization of the computer equipment can be coped with. Further, damage due to an external force can be avoided, resulting in improvement in life characteristics, as compared with a case where the surface of semiconductor ceramics is coated with a resistance film.

TABLE 1

| Resistance Material | Sample No. | | | | | | | | |
|---|---|---|---|---|---|---|---|---|---|
| | 1 | 2 | 3 | 4 | 5 | 6 | 7 | 8 | 9 |
| $RuO_2$ | 100 | 90 | 80 | 60 | 40 | 20 | 80 | 40 | 80 |
| $Pb_2RU_2O_7$ | — | 10 | 20 | 40 | 60 | 80 | — | — | 10 |
| $Bi_2RU_2O_7$ | — | — | — | — | — | — | 20 | 60 | 10 (wt %) |

TABLE 2

| Sample No. | * (Ω) | 3CV (%) | V1mA (V) | 3CV (%) | α | 3CV (%) | Cap. (pF) | 3CV (%) |
|---|---|---|---|---|---|---|---|---|
| monitor | 0.1 | 9.8 | 32.6 | 6.4 | 35 | 3.4 | 210 | 5.5 |
| 1 | 225 | 5.8 | 31.1 | 6.5 | 34 | 3.1 | 213 | 6.3 |
| 2 | 390 | 6.5 | 32.7 | 7.1 | 36 | 4.6 | 220 | 6.8 |
| 3 | 789 | 7.2 | 31.8 | 6.2 | 35 | 4.1 | 219 | 5.7 |
| 4 | 1570 | 9.7 | 32.7 | 5.8 | 37 | 3.8 | 219 | 7.4 |
| 5 | 8530 | 18.1 | 32.1 | 7.8 | 34 | 2.6 | 224 | 5.5 |
| 6* | 75800 | 39.6 | 31.3 | 6.4 | 36 | 3.7 | 225 | 6.3 |
| 7 | 548 | 8.4 | 31.5 | 7.3 | 36 | 4.2 | 218 | 7.0 |
| 8 | 7640 | 15.6 | 32.0 | 7.2 | 35 | 3.5 | 220 | 6.2 |
| 9 | 420 | 5.5 | 32.4 | 6.9 | 35 | 3.2 | 217 | 7.2 |

*Resistance Value

Table 1 and Table 2 are for explaining the results of a test performed so as to confirm the effect of the noise filter 1 according to the present embodiment. In this test, the amount of $Pb_2Ru_2O_7$ or $Bi_2Ru_2O_7$ added to $RuO_2$ is changed within the range of not more than 80% by weight, to produce a lot of samples No. 1 to No. 9 by the above described producing method, as shown in Table 1. Measurements are made of a resistance value (Ω), a varistor voltage ($V_{1mA}$), a non-linearity index (α), and a capacitance value (pF) of each of the samples No. 1 to 9, and the variation of ! each of them is examined. The variation is found by 3 $CV = \rho \times 3/(average)$. For comparison, a Ag - Pd alloy is printed in place of the resistance film, to produce a monitor, and the same measurements are made.

As can be seen from Table 2, in the case of the monitor having no resistance film added thereto, the varistor voltage, the non-linearity index, and the capacitance value can be satisfied, while the resistance value is so small as to be 0.1 Ω, that is, the ability to restrain a voltage is small. Further, in the case of the sample No. 6 in which the amount of addition of the Ru compound is 80% by weight (see "* mark"), the resistance value is so significantly large as to be 75800 Ω, which is too large as a resistance value for restraining a voltage, and the variation thereof is so large as to be 39.6%. On the other hand, in the case of the samples Nos. 1 to 5 and Nos. 7 to 9 in which the amount of addition of the Ru compound is not more than 60% by weight, the varistor voltage, the non-linearity index and the capacitance value can be all satisfied. In addition, when the amount of addition of the Ru compound is increased, the resistance value is increased, and the variation thereof is liable to be larger. However, the resistance value is 225 to 8530 Ω, that is, the ability to restrain a voltage is improved, and the variation thereof is within the allowable range of 5.5 to 18.1%. From the foregoing, it is desirable that the amount of addition of the above described Ru compound be within the range of not more than 60% by weight. When a square wave of 2 KV×200 nSEC is applied to the resistance film in each of the above described samples Nos. 1 to 9 using a noise simulator, the variation of the resistance value is less than 2%.

Figure 4:
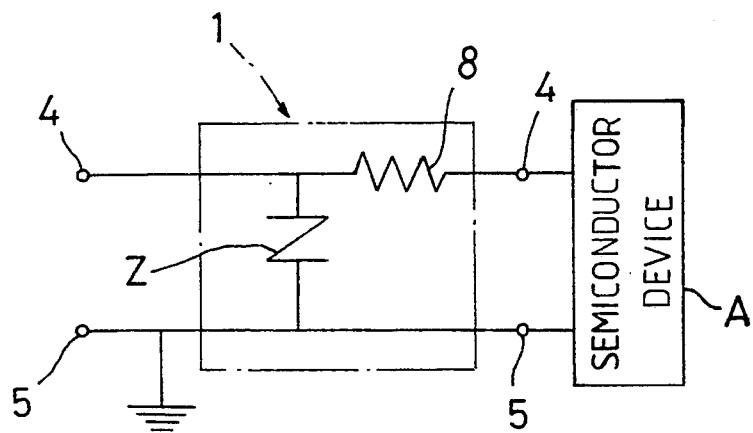
FIG. 4 is a diagram showing a circuit structure of the noise filter according to the embodiment.
Figure 5:
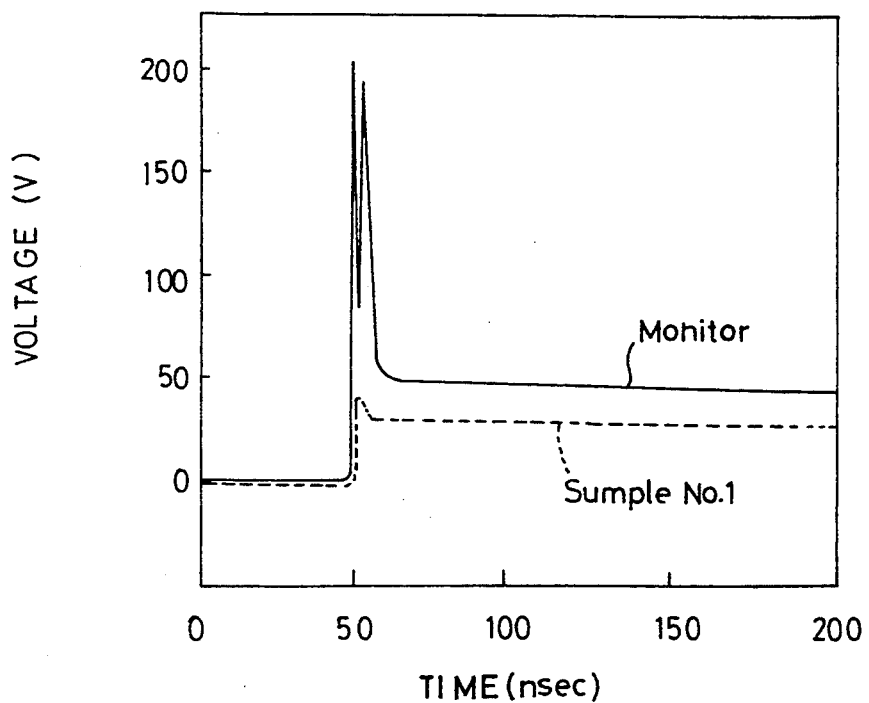
FIG. 5 is a characteristic diagram for explaining the effect of the noise filter according to the embodiment.

FIG. 5 shows a pulse waveform in a case where the above described monitor and the sample No. 1 are employed to construct circuits as shown in FIG. 4 and a high-voltage pulse is applied thereto. As can be seen from FIG. 5, the voltage is 200 V in the case of the monitor (indicated by a solid line), while being approximately 40 V in the case of the sample No. 1 (indicated by a broken line). From this point, the sample containing a resistance film is high in the ability to restrain a voltage, which is effective in protecting the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A noise filter for receiving an input voltage pulse having a predetermined high level and outputting an output voltage which is less than a predetermined lower level, the noise filter comprising:
   (A) a varistor including:
   semiconductor ceramics having a pair of end surfaces opposed to each other and a pair of side surfaces connecting said pair of end surfaces;
   first and second end surface electrodes respectively formed on said end surfaces of said semiconductor ceramics for receiving said input voltage and outputting said output voltage, respectively;
   at least one side surface electrode formed on a side surface of said semiconductor ceramics;
   a first inner electrode formed inside said semiconductor ceramics and electrically connected to said first end surface electrode; and
   a second inner electrode formed inside said semiconductor ceramics so as to be overlapped with the first inner electrode while being separated from the first inner electrode by a semiconductor ceramic layer,
   said second inner electrode being electrically connected to said side surface electrode; and
   (B) a resistance layer having a high resistivity formed inside said semiconductor ceramics as a separate layer from said first and second inner electrodes of said varistor and electrically connected between said first and second end surface electrodes,
   said resistance layer providing a voltage drop between said first and second end surface electrodes in response to an input voltage pulse of said predetermined high level such that voltage at said second end surface electrode is less than said predetermined lower level.

2. The noise filter according to claim 1, wherein said resistance layer is made of a material comprising of Ru.

3. A noise filter comprising:
   semiconductor ceramics having a pair of end surfaces opposed to each other and a pair of side surfaces connecting said pair of end surfaces;
   end surface electrodes respectively formed on said end surfaces of said semiconductor ceramics;
   at least one side surface electrode formed on said side surfaces of said semiconductor ceramics;
   a first inner electrode formed inside said semiconductor ceramics and electrically connected to one of said end surface electrodes;
   a second inner electrode formed inside said semiconductor ceramics so as to be overlapped with the first inner electrode while being separated from the first inner electrode by a semiconductor ceramic layer,
   said second inner electrode being electrically connected to said side surface electrode; and
   a resistance layer formed inside said semiconductor ceramics and electrically connected between said end surface electrodes,
   wherein said resistance layer is made of a material having 60% by weight of $Pb_2Ru_2O_7$ or $Bi_2Ru_2O_7$ added to $RuO_2$.

4. The noise filter according to claim 1, wherein said resistance layer comprises a resistive paste printed on a ceramic green sheet and cofired with the ceramic green sheet.

5. The noise filter according to claim 1, wherein said semiconductor ceramics are made of a ceramic material comprising ZnO.

6. The noise filter according to claim 1, which further comprises a glass film formed so as to coat an outer surface portion, excluding a portion covered with the end surface electrodes and the side surface electrode, of said semiconductor ceramics.

7. The noise filter according to claim 3, wherein said resistance layer comprises resistive paste printed on a ceramic green sheet and cofired with the ceramic green sheet.

8. The noise filter according to claim 3, wherein said semiconductor ceramics are made of a ceramic material comprising ZnO.

9. The noise filter according to claim 3, which further comprises a glass film formed so as to coat an outer surface portion, excluding a portion covered with the end surface electrodes and the side surface electrode, of said semiconductor ceramics.

10. A noise filter comprising:
    semiconductor ceramics having a pair of end surfaces opposed to each other and a pair of side surfaces connecting said pair of end surfaces;
    end surface electrodes respectively formed on said end surfaces of said semiconductor ceramics;
    at least one side surface electrode formed on said side surfaces of said semiconductor ceramics;
    a first inner electrode formed inside said semiconductor ceramics and electrically connected to one of said end surface electrodes;
    a second inner electrode formed inside said semiconductor ceramics so as to be overlapped with the first inner electrode while being separated from the first inner electrode by a semiconductor ceramic layer,
    said second inner electrode being electrically connected to said side surface electrode; and
    a resistance layer formed inside said semiconductor ceramics and electrically connected between said end surface electrodes,
    wherein said resistance layer is made of a material having 60% by weight of $Pb_2Ru_2O_7$ and $Bi_2Ru_2O_7$ added to $RuO_2$.

11. The noise filter according to claim 10, wherein said resistance layer comprises resistive paste printed on a ceramic green sheet and cofired with the ceramic green sheet.

12. The noise filter according to claim 10, wherein said semiconductor ceramics are made of a ceramic material comprising ZnO.

13. The noise filter according to claim 10, which further comprises a glass film formed so as to coat an outer surface portion, excluding a portion covered with the end surface electrodes and the side surface electrode, of said semiconductor ceramics.

14. A noise filter for receiving an input voltage pulse having a predetermined high level and outputting an output voltage which is less than a predetermined lower level, the noise filter comprising:

(A) a varistor including:

semiconductor ceramics having a pair of end surfaces opposed to each other and a pair of side surfaces connecting said pair of end surfaces;

first and second end surface electrodes respectively formed on said end surfaces of said semiconductor ceramics for receiving said input voltage and outputting said output voltage, respectively;

at least one side surface electrode formed on a side surface of said semiconductor ceramics;

a first inner electrode formed inside said semiconductor ceramics and electrically connected to said first end surface electrode; and a second inner electrode formed inside said semiconductor ceramics so as to be overlapped with the first inner electrode while being separated from the first inner electrode by a semiconductor ceramic layer, said second inner electrode being electrically connected to said side surface electrode; and (B) a resistance layer formed inside said semiconductor ceramics as a separate layer from said first and second inner electrodes of said varistor and electrically connected between said first and second end surface electrodes to absorb overvoltage in excess of the voltage restrained by said varistor.

15. A noise filter for receiving an input voltage pulse having a predetermined high level and outputting an output voltage which is less than a predetermined lower level, the noise filter comprising:

(A) a varistor including:

semiconductor ceramics having a pair of end surfaces opposed to each other and a pair of side surfaces connecting said pair of end surfaces;

first and second end surface electrodes respectively formed on said end surfaces of said semiconductor ceramics for receiving said input voltage and outputting said output voltage, respectively;

at least one side surface electrode formed on a side surface of said semiconductor ceramics;

a first inner electrode formed inside said semiconductor ceramics and electrically connected to said first end surface electrode; and a second inner electrode formed inside said semiconductor ceramics so as to be overlapped with the first inner electrode while being separated from the first inner electrode by a semiconductor ceramic layer, said second inner electrode being electrically connected to said side surface electrode; and (B) a resistance layer having a resistivity that is higher than a resistivity of said first and second inner electrodes, said resistance layer being formed inside said semiconductor ceramics as a separate layer from said first and second inner electrodes of said varistor and electrically connected between said first and second end surface electrodes, said resistance layer providing a voltage drop between said first and second end surface electrodes in response to an input voltage pulse of said predetermined high level such that voltage at said second end surface electrode is less than said predetermined lower level.

* * * * *